(12) United States Patent
Kriegel et al.

(10) Patent No.: US 6,300,256 B1
(45) Date of Patent: Oct. 9, 2001

(54) METHOD AND DEVICE FOR PRODUCING ELECTRICALLY CONDUCTIVE CONTINUITY IN SEMICONDUCTOR COMPONENTS

(75) Inventors: Bernd Kriegel; Frank Kudella; Rene Arnold, all of Berlin (DE)

(73) Assignees: Dr. Johannes Heidenhain GmbH, Traunreut; Silicon Sensor GmbH, Berlin, both of (DE)

( * ) Notice: Subject to any disclaimer, the term of this patent is extended or adjusted under 35 U.S.C. 154(b) by 0 days.

(21) Appl. No.: 09/446,408
(22) PCT Filed: Jun. 22, 1998
(86) PCT No.: PCT/DE98/01768
§ 371 Date: Dec. 20, 1999
§ 102(e) Date: Dec. 20, 1999
(87) PCT Pub. No.: WO98/59098
PCT Pub. Date: Dec. 30, 1998

(30) Foreign Application Priority Data

Jun. 20, 1997 (DE) .............................. 197 27 693

(51) Int. Cl.[7] .......................... H01L 21/26; H01L 21/324; H01L 21/42; H01L 21/477
(52) U.S. Cl. ........................... 438/795; 438/799; 219/413
(58) Field of Search .................................. 438/795, 799, 438/5, 7; 219/411, 413

(56) References Cited

U.S. PATENT DOCUMENTS 5,970,214 * 10/1999 Gat ...................................... 392/416

\* cited by examiner

Primary Examiner—Vu A. Le
Assistant Examiner—Bradley Smith
(74) Attorney, Agent, or Firm—Christie, Parker & Hale, LLP (57) ABSTRACT

The invention relates to a process and a device for the production of electrically conductive passages in semiconductor components preferably positioned on a semiconductor, by means of thermo-migration through the production of a temperature gradient between two opposing outer surfaces of the semiconductor components and application of a conductive doping substance to a cooler outer surface. One outer surface of the semiconductor is positioned on a cooled sample take-up and the opposing outer surface is exposed to heat radiation, which can be controlled both with regard to its total efficiency and its efficiency distribution over the surface of the semiconductor. The total efficiency and/or the efficiency distribution of the heat radiation is adjusted depending upon the temperature measured on at least one temperature measurement point on the semiconductor and/or a semiconductor component.

42 Claims, 8 Drawing Sheets

METHOD AND DEVICE FOR PRODUCING ELECTRICALLY CONDUCTIVE CONTINUITY IN SEMICONDUCTOR COMPONENTS

FIELD OF THE INVENTION

The invention relates to a process for producing electrically conductive passages in semiconductor components and to a device for implementing the process.

BACKGROUND OF THE INVENTION

U.S. Pat. No. 4,159,215 disclosed a process for penetrating a semi-conducting body of a semiconductor component consisting of doped silicon, germanium, or the like whereby, the semiconductor component has opposite-lying outer surfaces, with an alloy with aluminum as the carrier material and phosphorus, arsenic, or antimony as the doping by means of temperature gradient zone melting. The semiconductor component is positioned in a metal vapor chamber and an aluminum-antimony layer with a layer thickness of 0.5 $\mu$m to 25 $\mu$m is applied to one of the two opposite-lying surfaces of the semiconductor component. By means of photo-lithography, the migration areas are fixed and the thus prepared component is positioned in a thermo-migration device. Through a temperature gradient of around 50° C. between the warmer base surface and the cooler upper surface applied to the semi-conducting body over a sufficient period of time, the alloy penetrates the semiconducting body.

Subsequently, the alloy areas on the base surface of the semiconductor component are etched away or grinded off, and the channels of re-crystallized semiconductor material and detached metal produced by means of thermo-migration remain.

Channels of this nature running from one outer surface to the opposite-lying outer surface of a semiconductor component are used in particular with SMD (Surface Mounted Devices) components, which are formed in such a way that the contact points of both electrodes can be positioned on one outer surface (of the rear side) of the component. A component of this nature can be connected with its rear side to a circuit board provided with suitable contact areas, without the need for additional wires or other connecting components.

A particular field of application is opto-electronic sensor components, i.e. radiation receptors that convert electromagnetic radiation energy (photons) into electric signals and which are of great significance in measuring technology. For example, in position measuring systems, such as length and angle measuring systems, (of the incremental or absolute type), several radiation receptors (especially photo-elements) are positioned behind a grid structure.

Radiation receptors of this nature are, as a rule, formed as blocking layer photo detectors. They contain a PN, PIN, MS or MOS junction, in which the conversion of electromagnetic radiation energy into an electric signal takes place by means of the photo blocking layer effect. To be able to measure and evaluate an electric signal, a radiation receptor should be provided with electric contacts and connected to a suitable electric switch. This integration into an electric switch frequently occurs on a circuit board, whereby receptors are preferably formed as SMD components.

For the purpose of producing an electrically conductive connection from one surface to the opposite-lying outer surface of a semi-conducting body, a cylindrical semiconducting channel of the p-type is, for example, produced between the p-conducting layer and the rear-side upper surface of the semi-conductor component, whereby this channel preferably has a diameter of 30 $\mu$m to 100 $\mu$m and, in addition to other connection processes, can be produced by means of thermo-migration.

The principle of thermo-migration is based upon the fact that the solubility of metal doping substances in semi-conducting materials, e.g. silicon, is temperature-dependent and increases with increasing temperature. If between the two opposite-lying outer surfaces of a sufficiently heated semi-conductor component a temperature gradient is produced and a suitable metal doping substance (e.g. aluminum for p-doping of n-conducting areas) is applied to the cooler outer surface of the component, the metal doping substance migrates to the opposite-lying warmer outer surface of the semi-conductor component. Through corresponding structuring of the cooler outer surface, to which the doping substance is applied (e.g. with the help of oxide layers), the formation of such channels can be achieved as desired.

U.S. Pat. No. 4,221,956 and U.S. Pat. No. 4,224,504 disclosed the carrying out of the migration process in a closed chamber and the placing of the semi-conductor on webs with a fixed distance in relation to the cooling device.

WO 83 03710 disclosed a process for carrying out the thermo-migration process on semi-conductors, whereby the correspondingly prepared semi-conductor is placed with one outer surface on an essentially even outer surface of a heat source, so that it lies on the outer surface of the heat source. The semi-conductor is heated, so that a temperature difference between the two outer surfaces of the semi-conductor is formed. Droplets of material with opposing conduction applied to the semiconductor thereby travel through the semi-conductor, and form conducting connections between the two outer surfaces. Subsequently, the heating element is cooled and the semi-conductor is removed. Through the direct contact between the semi-conductor and the heat source, a high temperature gradient is produced in the semi-conductor and thus the process is accelerated. A disadvantage of the state of technology is that even temperature guiding of this nature is barely possible.

It is an object of the present invention that during the production of semiconductor components by means of thermo-migration, the adjustment of the outer surface temperature of the semiconductor during the process be guided so that a sure penetration of conductive passage channels through the semi-conductor wafer with fixed pn-passages is possible in a minimum time, whereby the doping of the semi-conductor components is not influenced as a result of the heating of the semiconductor wafer, and whereby the form of the semi-conductor wafer is not changed. In addition, interactions between the outer surface of the heat source and/or the cooling device and the wafer are intended to be avoided.

SUMMARY OF THE INVENTION

The outer surface temperature of the semi-conductor is measured on at least one temperature measurement point and this temperature forms the basis for controlling the total efficiency of the heat input into the semi-conductor and/or the efficiency distribution of the heat input over the upper surface of the semi-conductor to be heated. This control is achieved through changing the distances between the semi-conductor and the heating and/or the cooling element.

Through targeted temperature control over the time period of the thermo-migration process and over the entire area of a semi-conductor wafer, the process according to the invention ensures penetration of the semi-conducting bodies of the semi-conductor components positioned on the semi-conductor wafer. This is achieved with the simultaneous exclusion of impurities during the process and in minimum time. Furthermore, the method ensures that the doping of the semi-conductor components is not influenced as a result of the heating of the semi-conductor wafer and that the form of the semi-conductor wafer is not influenced for example, through buckling, as a result of the heat radiation affecting the semi-conductor wafer.

In a preferred embodiment of the invention the semi-conductor is positioned in a closed system preferably filled with an inert gas that is a good heat conductor. By placing the semi-conductor in a closed system filled with an inert gas, impurities are avoided on the semi-conductor. Furthermore, the heat flow for both heating one outer surface of the semi-conductor and cooling the other outer surface are optimized. It is thereby preferable to use helium in the laminar flow area at a pressure of 0.1 mbar to 30 mbar.

Furthermore, the effectiveness and controllability of the heat distribution on the semi-conductor is improved in that the outer surfaces of the semi-conductor are positioned in areas that are separated from one another, so that, for example, the coupling of the energy for the purpose of heating the semi-conductor occurs via the good heat-conducting gas and less via radiation energy for example.

In a preferred embodiment of the present invention the semi-conductor can be moved perpendicularly to the plane between the heat source and the cooling device. Therefore, the placing of the semi-conductor in the thermo-migration device and its removal through the moving of the semi-conductor from a charging position into a heating position and vice versa is facilitated.

Preferably the temperature of the semi-conductor is measured in a non-contact way with a pyrometric measuring device via an optical measuring channel.

According to a further characteristic of the invention, the semi-conductor is heated with a temperature increase smaller than or equal to 30° C./second. Subsequently, the temperature is maintained constant until the thermo-migration process is complete. In a first cooling phase, there is cooling with decreasing heat radiation and subsequently there is free cooling over a given time span down to the removal temperature.

A device is disclosed for producing electrically conductive passages in a disc-form semi-conductor by means of thermo-migration through the production of a temperature gradient between two opposing outer surfaces of the semi-conductor and the application of a conductive doping substance to one outer surface with a support for accommodating the semiconductor positioned between a heat source and a cooling device. The heat source emits a homogeneous heat radiation to the one outer surface of the semi-conductor turned towards it. The device has a pyrometer measurement head for measuring the outer surface temperature of the semi-conductor and wherein the distance between the support and the heat source and/or the support and the cooling device can be changed depending upon the measured outer surface temperature.

Because the distances between the support and the heat source and/or the cooling device are controlled depending upon the measured temperature, it is possible to achieve an exact temperature control for optimizing the course of the thermo-migration process within the shortest possible time. Furthermore, a high degree of purity is ensured and as little influencing as possible of the semiconductor doping, and it is ensured that the even form of the semiconductor wafer is not changed by temperature fluctuations.

In an advantageous embodiment of the device according to the present invention, the area between the heat source and the cooling device is encapsulated and is preferably filled with an inert gas that is a good heat conductor. Preferably the inert gas is hydrogen or helium.

Through the use of an inert gas that is a good heat conductor, reactions of gas particles with the semiconductor and the heating device are avoided. At the same time, a large heat flow for heating one outer surface of the semiconductor as well as a correspondingly good cooling of the opposing outer surface of the semiconductor for the purpose of optimizing the thermo-migration process are ensured.

A subdivision of the area in the plane of the support brings about a system division that is a pre-condition for an optimized control of the heating and cooling of the semiconductor during the thermo-migration process and for avoiding warping on a semiconductor wafer. An additional form of control consists in the changeability of the gas pressure in the one or more areas. An additional form of control is the changeability of the gas flow into the one or more areas.

In another embodiment of the device according to the invention, the heat source consists of a directly or indirectly heated furnace. In this embodiment of the heat source, a homogeneous heat distribution to one outer side of the semiconductor and/or the semiconductor wafer turned towards the furnace is ensured and a buckling of the semiconductor and/or semiconductor wafer as a result of unequal heating is avoided.

Preferably, the furnace has a plate corresponding essentially to the surface of the support, whereby the plate can be heated by means of resistive heating, inductive heating, electron beam heating or microwave heating. The plate consists in particular of a graphite material pyrolytically sealed, preferably, with boron nitride or of purest ceramics. The plate is preferably positioned in a vacuum to direct the heat radiation emitted by the plate exclusively to the semiconductor to optimize the efficiency of the thermo-migration device. Therefore, there is a risk of vaporization of particles in the area on the plate and thus, the risk of a change in the semiconductor structure, which is avoided by choosing a corresponding chemically and physically inactive sealing or plate material.

In an additional embodiment of the invention, the heat source consists of a halogen lamp field that extends over at least the surface of the semiconductor wafer, whereby the halogen lamp field preferably consists of a crossed halogen lamp field positioned in two planes. The preferably crossed halogen lamp field facilitates individual controllability of the heat input into the semiconductor wafer and an exact, even heating over the entire surface thereof, in such a way that homogeneous heat radiation is ensured on the outer surface of the semiconductor wafer that is turned towards the halogen lamp field. Through the controllable course of the temperature over the semiconductor wafer outer surface, there is the possibility of raising the temperature to the edge of the wafer outer surface so that an individual temperature profile can be set over the wafer outer surface. The adjustability of the light adaptation, i.e. the efficiency distribution for the temperature homogenization, ensures equal conditions over the entire one outer surface of the semiconductor wafer so that by means of a special temperature measuring process, optimal conditions for thermo-migration can be set.

In a preferred embodiment of the invention a sample plunger consists of a sample cylinder, a sample head forming the covering surface of the sample cylinder and taking up the semiconductor wafer, a sample flange projecting outwards on the under side of the sample cylinder and a lifting plate sealing the sample cylinder to the under side in a gas-proof way, whereby the sample plunger can be extracted from and inserted into a recipient in an axial direction, whereby this recipient consists of a ray junction surface turned towards the halogen lamp field and a quartz cylinder.

The cylinder form of the sample take-up ensures a separation of the process area from the surroundings in such a way that the thermo-migration process can take place under the purest conditions through the introduction of an inert gas into the process area. It is thereby ensured that the addition of cool liquid and process gases takes place, for sealing reasons, sufficiently far away from the heating position of the semiconductor wafer. Because of this distance, sufficient cooling is ensured.

In an additional embodiment of the invention there is a pyrometer measuring head, centrally within the sample cylinder of the sample plunger which, via a temperature measurement and gas channel as well as a measurement window in the temperature measurement and gas channel, is oriented to the upper surface of the semiconductor wafer turned towards the sample head, whereby the pyrometer measuring head is fixed and adjusted on the sample plunger by means of a pyrometer flange, and preferably works with a wavelength of 2.2 $\mu$m, and has a finely adjustable focusing cone, that is oriented to the outer surface of the semiconductor wafer in such a way that there is a small measurement spot in the middle of the semiconductor wafer.

The fixing and adjustment of the pyrometer measurement head ensures a finely adjustable focusing cone, that includes only a small spot on the semiconductor wafer, so that there is no significant interference between the semiconductor wafer and the sample head as a result of the temperature measurement. The measurement spot is representative of the temperature on the entire semiconductor wafer, as the efficiency distribution over the outer surface of the semiconductor wafer can be adjusted by means of the individually controllable halogen lamps of the crossed halogen lamp field.

The sample head preferably has three head planes, whereby the sample take-up is connected to the first head plane, which has the central temperature measurement and gas channel as well as several radially distributed gas channels, running diagonally through the first sample head plane, whereby a gas that is a good heat conductor, such as helium or hydrogen, is fed through these channels and exits through nozzle-like openings of the channels and flows under the semiconductor wafer. The addition of gas serves to maintain the purity of the process area, whereby the flow is preferably adjusted with a 0.5 to 50 mbar/l gas flow in such a way that the semiconductor wafer is not raised through the gas flow and no inhomogeneities arise.

BRIEF DESCRIPTION OF THE DRAWINGS

The teaching underlying the invention will now be clarified by reference to the embodiment shown in the drawings. The drawings show.

DETAILED DESCRIPTION

Figure 1:
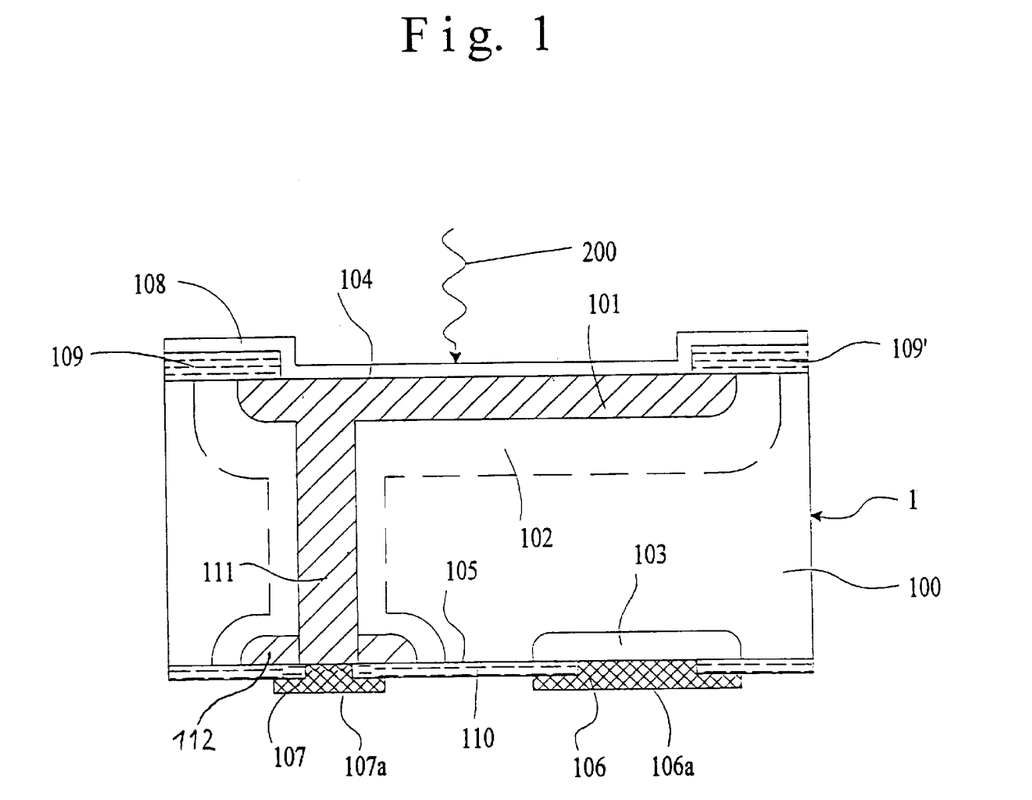
FIG. 1 is a cross-section through an opto-electronic sensor component with a cylindrical, semi-conducting connection channel from the front side to the rear side of the semiconductor component.

The section of an opto-electronic sensor component shown in FIG. 1 as an example for the use of the process of the invention for producing conductive channels through a semi-conducting body of a semiconductor component shows a semiconductor component 1, the body of which consists of silicon and has a wide n-conducting layer 100 (300 $\mu$m to 400 $\mu$m thick), on the front surface of which a considerably thinner p-conducting layer 101 (around 0.55 $\mu$m thick) extends. Between the two semi-conducting layers 100, 101, a depletion region 102 forms, which works as a blocking layer.

The front side of the component 1 is provided with an anti-reflection layer 108 and is structured through insulating layers 109 and 109' which can for example consist of silicon dioxide. Between the two insulating layers 109, 109', the radiation-side outer surface area 104 extends, which is formed by an outer surface of the p-conducting layer 101. Electro-magnetic radiation 200 encountering the outer surface area 104 goes through the p-conducting layer 101 into the depletion region 102 and is largely absorbed there. Electron-hole pairs are thereby formed in the depletion region 102. The depletion region divides these carrier pairs; electrons flow to the n-side, holes flow to the p-side. In order to be able to measure this photo-flow, which is a measure for the radiation efficiency, the component 1 must be integrated into a suitable electric switch. Frequently, an electric switch of this nature has several photo-elements and further semiconductor components, that are mutually positioned on a circuit board.

For the purpose of connecting the component 1 to an electric switch of this nature, on its rear-side outer surface 105 structured through insulating layers 110, there are electrodes 106 and 107 with flat contact points 106a and 107a made from solderable material. The rear-side outer surface 105 is thereby formed from an outer surface of the n-conducting layer 100 itself. The connection electrode 106 of the n-conducting layer 100 is positioned on a low-Ohm, strongly doped area 103 of the semi-conducting layer 100, in order to minimize the contact resistance.

In order to be able to position the connection electrode 107 of the p-conducting layer 101 also on the rear-side outer surface 105 of the component 1, a cylindrical semiconducting channel 111 of the p-type extends from the p-conducting layer 101 to the rear-side outer surface 105 of the component 1. The p-conducting channel 111 preferably has a diameter of 30 $\mu$m to 100 $\mu$m and is produced by means of thermo-migration.

Furthermore, the rear-side end of the junction 111 is surrounded by an additional p-conducting area 112, which can for example be produced through ion implantation or ion diffusion and which facilitates a faultless contacting of the p-conducting layer 101 via the cylindrical area 111 and the electrode 107. The expansion of the additional p-conducting area 112 is selected in such a way that it surrounds the near upper surface section of the cylindrical area 111 so far that the interferences in the electronic structure arising in the vicinity of the upper surface during production of the cylindrical area 111 are eliminated as far as possible. The thickness of the additional p-conducting area lies in the region of 0.6 µm.

Due to the electrodes 106/107 of the n-conducting layer 100 and the p-conducting layer 101 lying next to each other on the rear-side outer surface 105 of the component 1, the component 1 can be very easily connected to a circuit board and thus integrated into an electric switch. For this purpose, the electrodes 106 and 107 with their contact points 106*a* and 107*a* must simply be positioned on contact surfaces of the circuit board provided for this purpose and be secured by soldering or ultrasound welding. Additional connecting elements, e.g. soldering bridges, between the electrodes of the component 1 and the circuit board are not necessary.

Figure 2A:
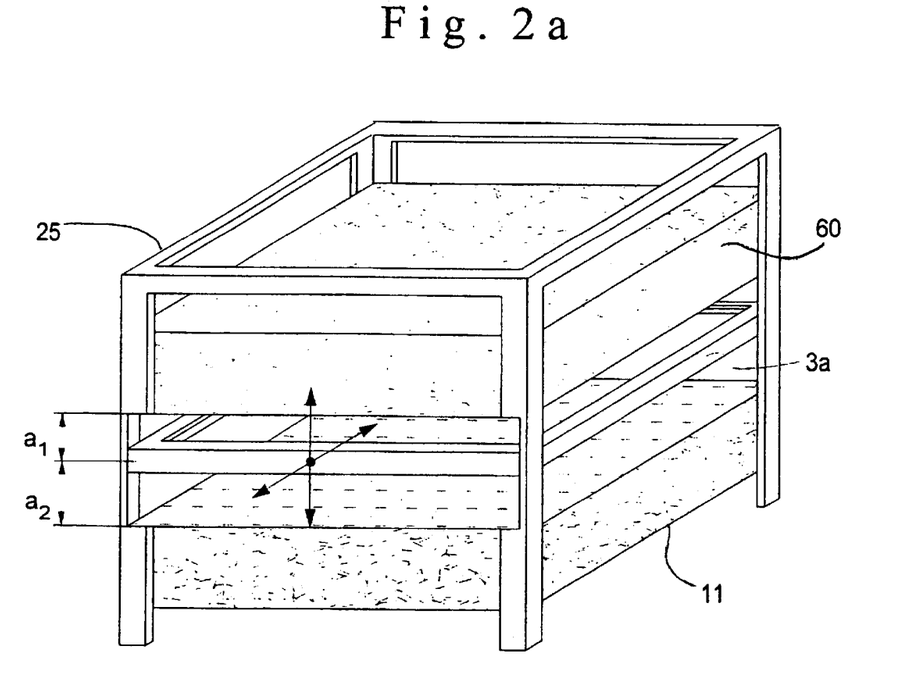
FIG. 2a is a schematic principle representation of a device for producing electrically conductive junctions in a disc-form semiconductor by means of thermo-migration.
Figure 2B:
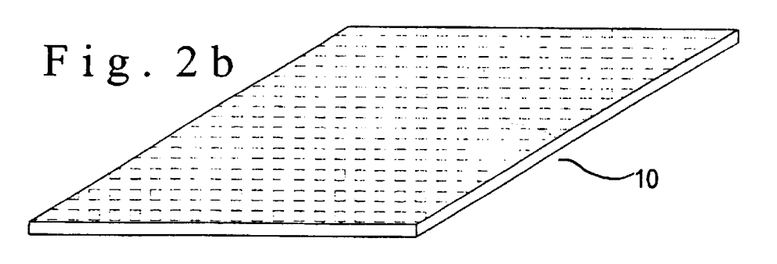
FIG. 2b is a schematic representation of a semiconductor wafer.
Figure 2C:
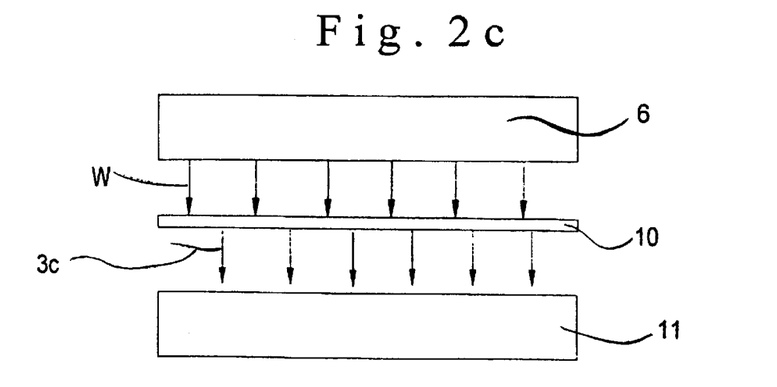
FIG. 2c is a cross-section through a device according to FIG. 2a with pins or webs for supporting a semiconductor wafer.
Figure 2D:
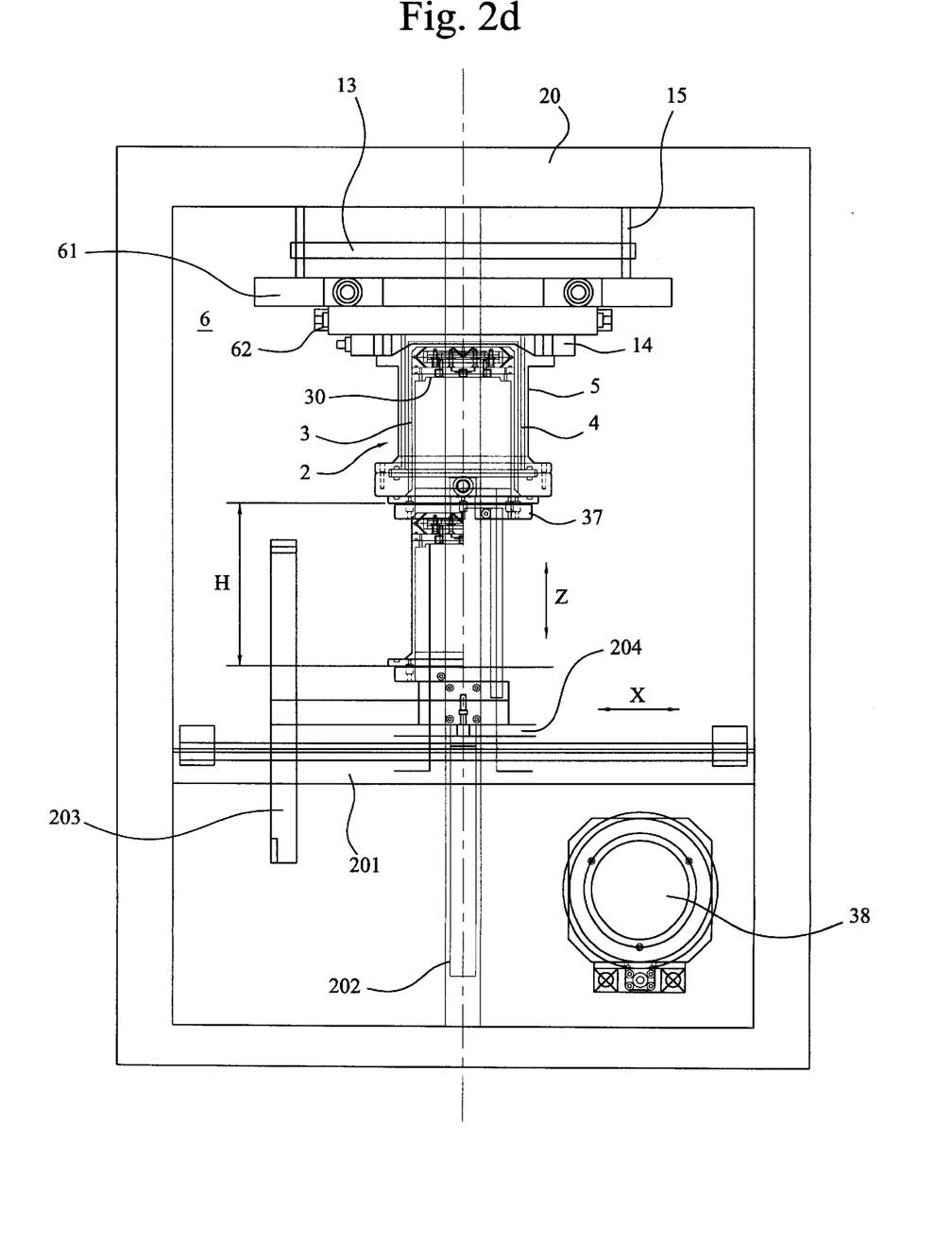
FIG. 2d is a side view of a device for producing junction channels in a semiconductor wafer by means of a lamp field as the heat source.

The conductive channels in the semi-conducting body of a semiconductor component according to FIG. 1 are for example produced with devices which are represented schematically in FIGS. 2*a* and 2*c* and in their entirety with a lamp field as the heat source in FIG. 2*d*. They serve for taking up a semiconductor wafer, i.e. a plate bar with a multitude of semiconductor components, which are doped and configured according to their purpose and application. Besides the devices shown in FIGS. 2*a*, 2*c* and 2*d*, other likewise-working devices are possible for taking up semiconductor wafers and producing conductive channels from one outer surface to the other outer surface of the semiconductor components positioned on the semiconductor wafer.

The device for producing electrically conductive passages in disc-form semiconductors by means of thermo-migration, which is shown in FIG. 2*a* as a functional diagram, consists of a stand 25, in which a plate 60 of a heat source, in particular a furnace, and a cooling device 11 are positioned. In the area between the plate 60 and the cooling device 11, there is a support in the form of a frame 3*a*, which in this embodiment of the invention can be adjusted according to the arrows on the frame 3*a* both in the plane of the longitudinal extension of the area between the plate 60 and the cooling device 11 and in the plane perpendicular thereto, i.e. adjusted in relation to height, in such a way that the distance of the frame 3*a* to the plate 60 and to the cooling device 11 can be changed. Therefore, the heat input into the semiconductor wafer 10 during heating as well as cooling of the semiconductor wafer 10 can be varied and/or maintained constant, according to a given reference curve, through a height adjustment of the frame 3*a* between the heat source 6 and the cooling device 11.

The longitudinal displacement of the frame 3*a* serves essentially for the placing of a semiconductor wafer 10 according to FIG. 2*b*, which can be inserted into the frame 3*a*, in the device for the production of electrically conductive passages by means of thermo-migration and also serves for the removal of the semiconductor wafer.

As an alternative to the configuration shown in FIG. 2*a* of a device for producing electrically conductive passages by means of thermo-migration, the support 3*a* for the semiconductor wafer 10 can for example only be displaceable in the longitudinal direction for the purpose of addition and removal of the semiconductor wafer, whereas the plate 60 and/or the cooling device 11 can be adjusted in relation to height, in such a way that the respective distance to the frame 3*a* can be changed.

The plate 60 is a component of a furnace which is not shown in greater detail, whereby for the purpose of heating the plate 60 this furnace can be heated by means of electrical resistive heating, an inductive heating device, electron beam heating, microwave heating and the like. Through corresponding energy input into the upper surface of the plate 60 turned away from the support 3 and/or the frame 3*a*, whereby this is achieved through the injection of electrons, coupling of radiation and the like, energy can be input into the plate 60 accordingly, which in turn ensures an even heat distribution over the entire surface of the device. Instead of a plate 60, any other suitable device can be used for even heat distribution.

Through the evenly heated plate 60, a homogeneous heat distribution in the outer surface turned towards the semiconductor wafer 10 is ensured. Because each inhomogeneity of the heat radiation emitted by the heat source is reproduced in the semiconductor wafer 10, an even heat distribution is particularly advantageous both for the production of electrically conductive passages over the entire surface of the semiconductor wafer and for avoiding a buckling of the semiconductor wafer and/or the individual semiconductor elements situated on it.

In order to ensure that the heat radiation emitted by the plate 60 is essentially oriented to the semiconductor wafer 10 positioned in the support 3*a*, the furnace and/or the plate 60 is thermally insulated by means of a vacuum, while the heat flow in the direction of the semiconductor wafer 10 located in the support 3*a* is preferably optimized by means of an inert gas that is a good heat conductor, such as hydrogen or helium, and in particular helium. In an installation of this nature, the hydrogen or helium gas particles are heated on the hot plate 60 and are input into the semiconductor wafer 10.

For the purpose of heat insulation and for the purpose of steering the heat radiation onto the semiconductor wafer, the heated plate 60 is positioned in a vacuum. It is therefore necessary, for the vaporization of particles which would lead to impurities in the semiconductor wafer to select a correspondingly inactive material for the plate 60. For this purpose, graphite with a boron nitride layer as well as a purest ceramic plate, may be used so that corresponding reactions are suppressed and the process of thermo-migration is not influenced by impurities.

For the purpose of cooling the semiconductor wafer 10 inserted in the support 3*a*, an inert gas, in particular helium, is used, to set the optimum temperature field for the process of thermo-migration on the under side of the semiconductor wafer 10. For the purpose of separate control of the temperature on the upper surface of the semiconductor wafer 10 and on the lower surface thereof, the area at the level of the frame 3*a* is preferably sub-divided in such a way that both the gas pressure and the flow speed can be adjusted separately in the area above the frame 3*a* and below the frame 3*a*. The separate temperature control that is thus possible creates the pre-condition for an optimum course of the thermo-migration process so that electrically conductive passages in the disc-form semiconductor are created in minimum time without buckling due to thermal straining of the semiconductor wafer.

A typical heat distribution in the device according to FIG. 2*a* has a plate temperature of $T_1=1800°$ C., a temperature on the outer surface of the semiconductor wafer 10 turned towards the plate 60 of $T_2=1050°$ C., as well as a temperature on the upper surface of the cooling device 11 of $T_3=20°$ C.

The heating of the semiconductor wafer 10 situated on the frame 3a can be controlled through a change in a distance $a_1$ between the plate 60 and the frame 3a and/or a distance $a_2$ between the frame 3a and the cooling device 11, as well as through corresponding control of the gas pressure and the flow speed of the gas in the area above and/or below the frame 3a. A preferred distance between the upper surface of the semiconductor wafer 10 and the lower side of the plate is:

$a_1=0.3$ mm

A preferred distance between the lower surface of the semiconductor wafer 10 and the cooling device 11 is:

$a_2=0.2$ to $0.5$ mm

In the area above the semiconductor wafer, a gas pressure of around 0.1 to 30 mbar is set.

Because the heat resistance of the semiconductor wafer 10 is very small compared to the heat resistance of the neighboring gas layers, the temperature $T_2$ on the outer surface of the semiconductor wafer oriented toward the plate 60 can be determined by the rough equation $$T_2 = \frac{a_2}{a_1+a_2} * (T_1 - T_3)$$

whereby $T_1$ is the plate temperature and $T_3$ is the temperature of the cooling device.

FIG. 2c shows a schematic cross-section through an alternative device, whereby instead of a frame 3a lying between the heat source 60 and the cooling device 11 for the purpose of taking up a semiconductor element 10, for example in the form of a silicon wafer, the support consists of pins or webs, that are supported on the cooling device 11 and/or fed into the cooling device 11, so that the distance of the semiconductor wafer 10 lying on the pins or webs to the cooling device 11, and thus to the heat source 6, can be changed. Therefore, with this configuration also, the heat input into the semiconductor wafer 10 during the heating and during the cooling of the semiconductor wafer 10 can be changed according to a pre-determinable reference curve. The heat radiation W affects the outer surface of the semiconductor wafer 10 turned towards the heat source; the heat radiation penetrates the semiconductor wafer 10 and is passed on to the cooling device 11.

The devices for producing electrically conductive passages in disc-form semiconductors by means of thermo-migration as shown in FIGS. 2a and 2c are particularly energy-efficient and optimal with regard to the thermo-migration process.

A device for producing passages through disc-form semiconductors by means of thermo-migration, as shown in detail in FIG. 2d, consists of a sample container 2 positioned in a machine frame 20, whereby this sample container 2 comprises a moveable sample plunger 3, a fixed recipient 4 and a likewise fixed outer shell 5. The sample plunger 3 can be moved in the direction of the double arrow X on a guide-way 201 from a loading position to a position below a handling position. By means of a guiding device 202, the sample plunger 3 can be displaced in the direction of the double arrow Z from the position below the handling position into the handling position over a lifting height H. A take-up device 203 for gas supply pipes, cooling pipes, measuring cables and the like is connected to the carriage 204 which takes up the sample plunger 3.

The upper side of the recipient 4 is positioned in a light exit aperture 14, that centers the sample container 2 below a heat source 6, whereby this heat source 6 preferably consists of two crossed halogen lamp fields 61, 62. The crossed halogen lamp fields 61, 62 have a multitude of halogen lamps that can be individually controlled, in such a way that a homogenous heat radiation is ensured on the outer surface of the semiconductor wafer 10 turned towards the heat source 6. As a result of the temperature pattern that can be regulated over the semiconductor wafer upper surface, there is the possibility of raising the temperature to the edge of the wafer upper surface, in such a way that an individual temperature profile can be set over the wafer upper surface. This adjustability of the light adaptation, i.e. the efficiency distribution for the temperature homogenization, ensures equal conditions over the entire upper surface of the semiconductor wafer, in such a way that by means of a special temperature measuring process optimum conditions for thermo-migration can be set.

Above the heat source 6, there is a mirror reflector 13, which together with the heat source 6 and the light exit aperture 14 is connected to the machine frame 20 via a mounting support 15.

A lifting plate comprising a 3-point lifting plate 37 and a guiding lifting plate 38 seals the sample plunger 3 to the under side, whereby the 3-point lifting plate 37 has a regular installation for the gas-proof sealing of the sample plunger 3.

Figure 3:
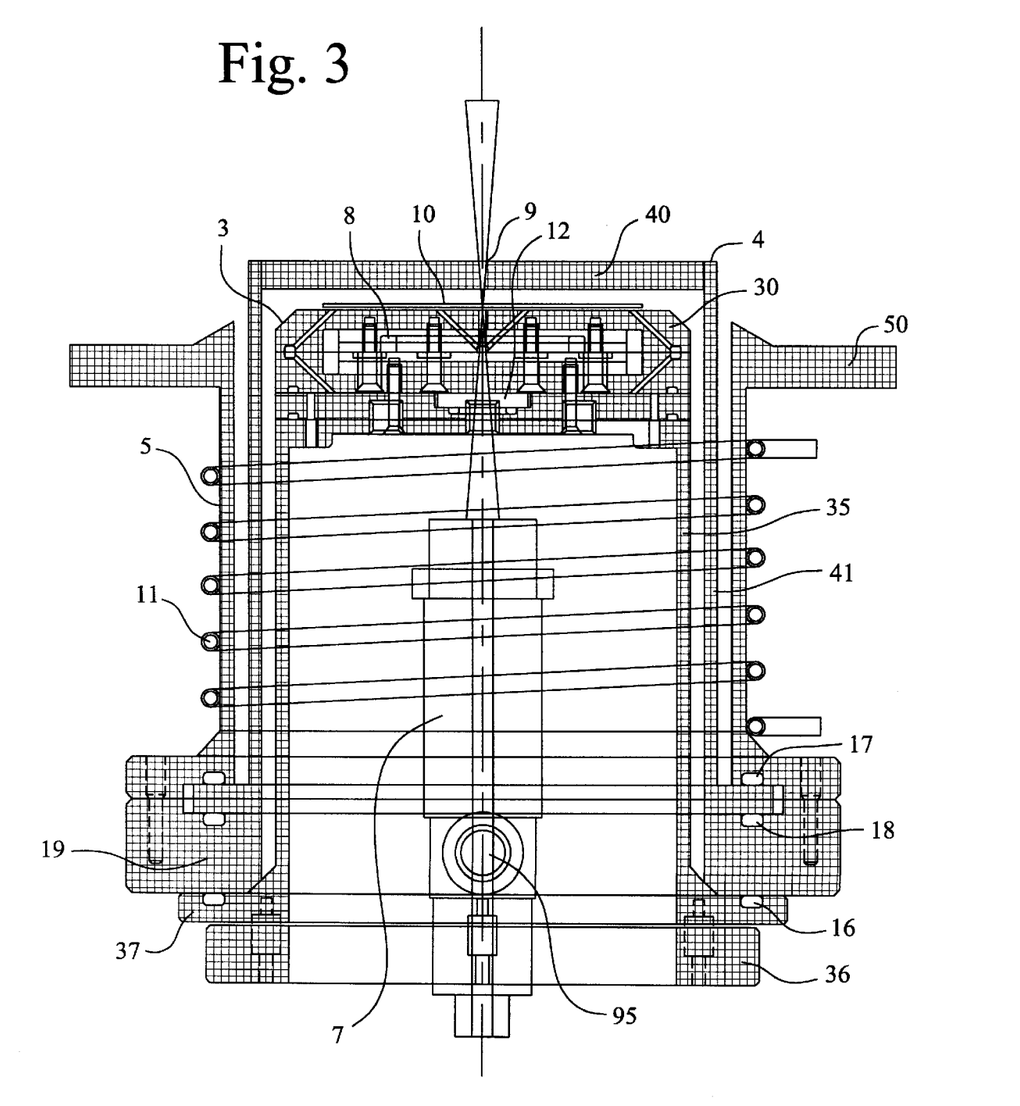
FIG. 3 is a longitudinal section of a sample container with external cooling for taking up a semiconductor wafer.

FIG. 3 shows a longitudinal section through the sample container 2 with a pyrometer measuring head 7 positioned therein.

The sample container 2 comprises the external outer shell 5 which is cooled by means of a cooling pipe 11 and the recipient or sample take-up cylinder 4 connected thereto by means of a seal 17, as well as the moveable sample plunger 3. The recipient 4 and the outer shell 5 are connected via a further seal 18 to a securing ring 19 and via a cover-side flange 50 of the outer shell 5 are secured on the light exit aperture 14 according to FIG. 2d.

In the working position shown in FIG. 3, the sample plunger 3 is inserted fully into the recipient 4, this sample plunger 3 lies with a lower sample flange 36 via a gas seal 16 on the securing ring in a gas-proof way.

The recipient 4 has on its upper side a transparent surface 40, through which the radiation emitted by the halogen lamp fields 61,62 of the heat source 6 goes onto a sample head 30 on the upper side of the sample plunger 3. On the sample head 30, there is a sample take-up for positioning the semiconductor wafer 10 to be processed. Through a three-point needle-type suspension, an equi-distant positioning of the semiconductor wafer 10 to the upper surface of the sample head 30 with a precision of 200 to 300 $\mu$m is ensured.

The transparent surface 40 of the recipient 4 has great optical homogeneity and, with a given wavelength, a high transmission ability. The transparent surface 40 preferably consists of quartz or sapphire.

Centrally within a sample cylinder 35 of the sample plunger 3, there is a pyrometer measurement head 7, which, via a temperature measurement and gas channel 9 as well as a measurement window 12 lying in the temperature measurement and gas channel 9 is oriented to the outer surface of the semiconductor wafer 10 turned towards the sample head 30 and/or the sample take-up. The pyrometer measurement head 7 with a preferred wavelength of 2.2 $\mu$m has a finely adjustable focusing cone, which includes only a small spot on the semiconductor wafer 10, in such a way that no significant interference between the semiconductor wafer 10 and the sample head 30 arises as a result of the temperature measurement. This measurement spot is representative of the temperature on the entire semiconductor wafer 10, because, as was previously explained in connection with FIG. 2d, the efficiency distribution over the upper surface of the semiconductor wafer 10 can be adjusted by means of the individually controllable halogen lamps of the crossed halogen lamp field 61, 62 of the heat source 6.

The measurement window 12, preferably consists of sapphire ($Al_2O_3$) which is preferred to a quartz window, because it is open into the wide infra-red wave area.

Figure 5:
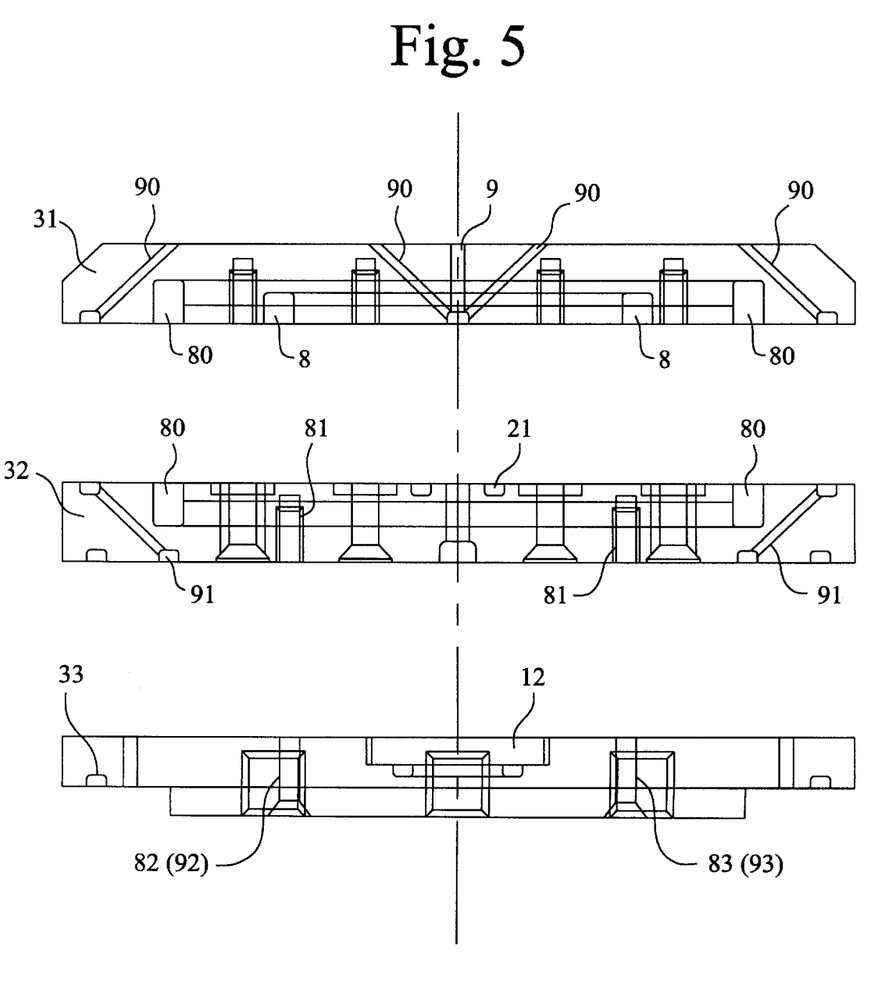
FIG. 5 is a longitudinal section through the individual planes.

According to FIGS. 5a, 5b, and 5c, the sample head 30 has three head planes 31, 32, 33, whereby the sample take-up is connected to the first sample head plane 31. The first sample head plane 31 of the sample head 30 has the central temperature measurement and gas channel 9 as well as several radially distributed gas channels 90 that are fed diagonally through the first sample head plane 31, whereby a gas that is a good heat conductor, such as helium or hydrogen, is fed through these gas channels 90 and exits via the nozzle-like openings of the channels 9/90, and flows under the semiconductor wafer 10. The addition of gas serves to maintain the purity of the process area, whereby the flow is adjusted preferably with 0.5 to 50 mbar/1 gas flow in such a way that the semiconductor wafer 10 is not raised through the gas flow and no inhomogeneities arise. The removal of the process gas occurs through an opening 95 in the base area of the sample cylinder 35.

The second sample head plane 32 of the sample head 30 has diagonal gas channels 91, the central temperature measurement and gas channel 9 and cool water channels 81, which lead to cooling elements 8 in the first head plane. Both the first and second sample head planes contain recesses 80 for the purpose of extension of the surface taking up heat. The connection between the first sample head plane 31 and the second sample head plane 32 occurs by means of liquid-proof sealing rings as well as gas-proof outer rings, that are positioned in corresponding openings on the facing upper surfaces of the first and second sample head plane 31, 32 of the sample head 30.

The third sample head plane 33 of the sample head 30 has a cool liquid inlet 82 and a cool liquid outlet 83, upon rotation of the third sample head plane 33 by 90°, it has a corresponding gas inlet 92 and gas outlet 93 for the process gas. The measurement window 12 is centrally located in the third sample head plane 33 of the sample head 30, and this measurement window 12 is located in the optical temperature measurement channel 9.

Figure 6:
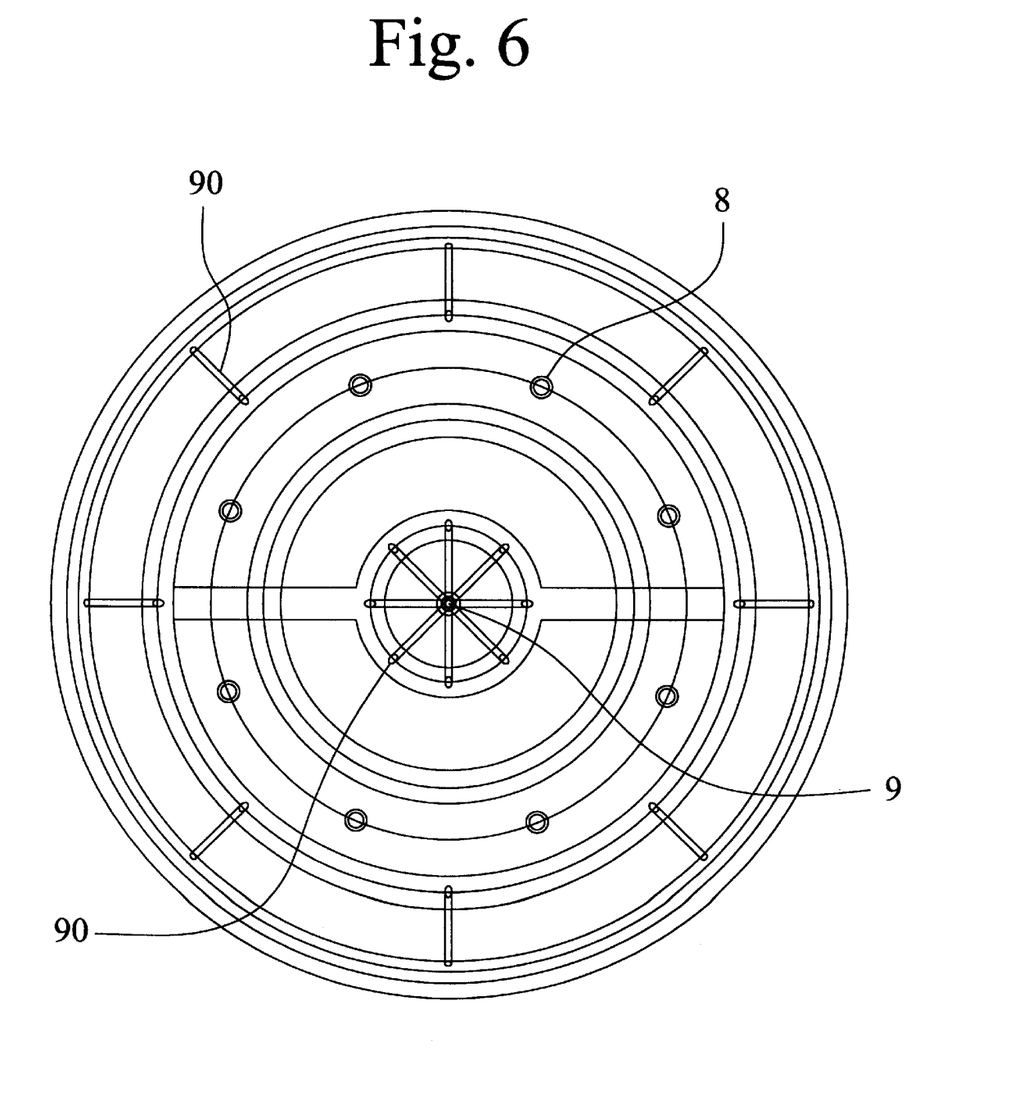
FIG. 6 is a top view of the first plane of the sample head.

A top view of the first sample head plane 31, as shown in FIG. 6, clarifies the configuration of the gas and cool liquid channels as well as the measurement opening 9 for recording the wafer temperature. The three sample head planes 31 to 33 are preferably manufactured from the purest aluminum.

The cooling pipe 11 shown in FIG. 3 positioned in spiral form around the outer shell 5 cools the sample container 2 from the upper side turned towards the heat source 6 to the base-side sealing area, so that the functioning ability of the seals between the outer shell 5, the recipient 4, and the sample plunger 3 is ensured.

Figure 4:
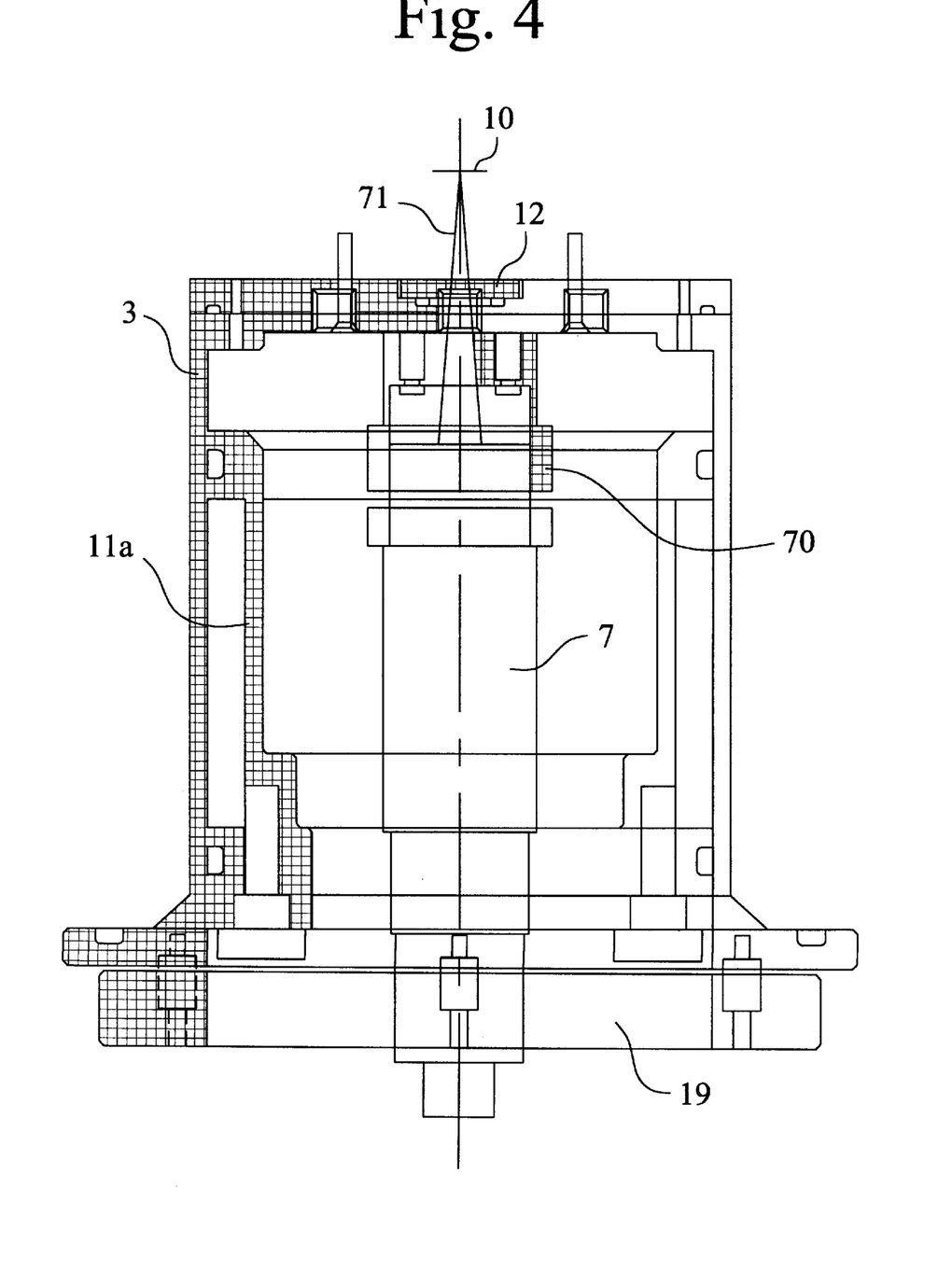
FIG. 4 is a schematic longitudinal section of a part of a sample container with internal cooling.

An additional embodiment of a cooling system is shown in FIG. 4, whereby a cooling cylinder 11a is positioned within the sample plunger 3 in such a way that a hollow space for taking up the cool liquid extends in a hollow cylinder form within the sample plunger 3. In an additional embodiment, an external cooling coil cooling system according to FIG. 3 is combined with an internal cooling cylinder cooling system according to FIG. 4.

The pyrometer measurement head 7 is fixed on the sample plunger 3 by means of a pyrometer flange 70, and it can be adjusted accordingly. The focusing cone 71 of the pyrometer measurement head 7 is oriented to the upper surface of the semiconductor wafer 10 in such a way that there is a small measurement spot in the middle of the semiconductor wafer 10 where there is no semiconductor component.

The above-described thermo-migration device ensures a very accurately controllable transportation of heat through the semiconductor wafer 10 from the outer surface of the semiconductor wafer 10 turned towards the crossed halogen lamp fields 61, 62 of the heat source 6 to the outer surface of the semiconductor wafer 10 turned towards the cooled sample head 30. With an adjustable temperature difference over the entire surface of the semiconductor wafer 10 of around 2° C. to 10° C., a thickness of the semiconductor wafer of around 300 µm, an electrically conductive (aluminum) droplet with a thickness of around 2 to 3 µm, whereby this droplet is positioned on the cooler outer surface of the semiconductor wafer 10 and/or of the semiconductor components positioned on the semiconductor wafer, travels to the opposite-lying warmer outer surface of the semiconductor wafer 10, and thus brings about the desired conducting connection between the opposite-lying outer surfaces of the semiconductor wafer and/or of the semiconductor components on the provided contact points.

Figure 7:
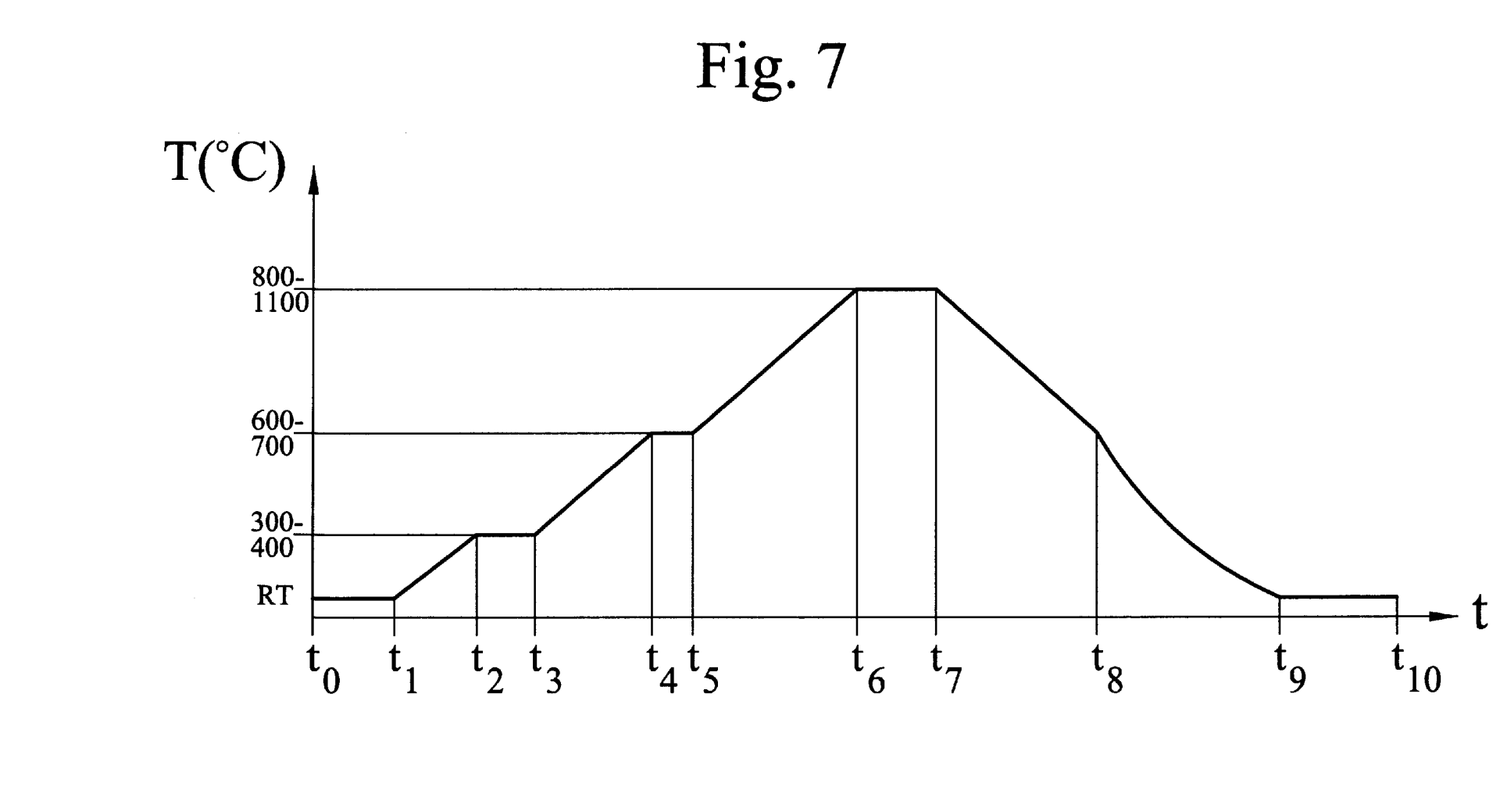
FIG. 7 is a schematic temperature-time diagram of the thermo-migration process according to the invention.

FIG. 7 clarifies an embodiment of the process according to the invention for producing electrically conductive connections between the opposite-lying outer surfaces of a semiconductor wafer by means of thermo-migration, whereby the process shown in FIG. 7 can be modified in various ways.

At the beginning of the process, at the $t_0$ point in time, the sample plunger 3 with the sample head 30 is taken out of the recipient 4 and/or the outer shell 5 in the direction of the arrow Z according to FIG. 2d, and is moved to the loading point. After the depositing of a semiconductor wafer 10 on the sample take-up of the sample head 30, the sample plunger 3 is firstly moved in an X direction and subsequently moved in a Z direction according to FIG. 2d into the handling position, i.e. moved into the recipient 4, and the system is closed. Subsequently, the sample plunger 3 is emptied and helium is allowed into the sample plunger 3 for the purpose of rinsing in a rinsing stage. The admission of cool water into the sample plunger 3 ends the preparation stage at the $t_1$ point in time.

Subsequently, by switching on the heat source 6, the sample is heated with a temperature increase of around 30° C. per second up to the $t_2$ point in time to a temperature of around 300° C. to 400° C. At this temperature, there is a further purification (helium rinse) of the sample atmosphere over a time period of around 1 minute until the $t_3$ point in time. Subsequently, the sample is further heated to a temperature of around 600° C. to 700° C. ($t_4$ point in time), whereby the aluminum droplet placed on the outer surface of the semiconductor wafer 10 reacts with the semi-conducting body through the formation of droplets ($t_5$ point in time). Subsequently, the sample is further heated to a working temperature of around 800° C. to 1100° C., whereby the migration process takes place, i.e. the aluminum droplet travels through the semi-conducting body of the semiconductor components positioned on the semiconductor wafer.

The migration speed is thereby proportional to the temperature gradient and the working temperature and determines the time period of the thermo-migration ($t_6$ to $t_7$). After the end of the migration process, the sample temperature is reduced in a ramp-form with a temperature decrease of around 30° C. per second. At a temperature of around 650° C. ($t_8$ point in time), the sample is left to free cooling, in such a way that the sample temperature is brought down over a time span of around 2 to 3 minutes ($t_9$ point in time). Subsequently, there is the removal of the sample plunger 3 from the recipient 4, the movement of the sample plunger 3 to the loading point, the removal of the semiconductor wafer and storage in for example a nitrogen-filled store room.

What is claimed is:

1. A thermo-migration process for producing electrically conductive passages in a disc-form semi-conductor having a first outer surface and a second outer surface opposed to the first outer surface wherein the first outer surface has a first distance to a heat source and the second outer surface has a second distance to a cooling device and wherein the second outer surface has a conductive doping substance applied to it, comprising:

producing a temperature gradient between the two opposing outer surfaces of the semi-conductor by heating the first outer surface, with even distribution over the first outer surface to a working temperature of the thermo-migration process of 800° C. to 1100° C.; and cooling the second outer surface with even distribution over the second outer surface;

adjusting at least one of the total efficiency of the heat input into the semi-conductor and the efficiency distribution of the heat input over the first outer surface of the semi-conductor to be heated depending upon the temperature measured on at least one temperature measurement point on the semi-conductor by changing the first and second distances.

2. A process according to claim 1 further comprising positioning the semi-conductor in a closed system filled with an inert gas which is a good heat conductor.

3. A process according to claim 2 wherein the inert gas comprises at least one of the group consisting of hydrogen and helium.

4. A process according to at least one of the preceding claims wherein the semi-conductor is movable perpendicularly to the plane between the heat source and the cooling device.

5. A process according to claim 1 wherein the first and second outer surfaces of the semi-conductor are positioned in areas separated from one another.

6. A process according to claim 1 wherein the heat radiation encounters the first outer surface of the semi-conductor in an essentially perpendicular way.

7. A process according to claim 1 wherein the semi-conductor is positioned on a sample plunger which can be moved in at least one plane, whereby this sample plunger is moved between a charging position and a radiation position.

8. A process according to claim 1 wherein the temperature of the semi-conductor is measured in a non-contact way with a pyrometric measurement device over an optical measurement channel.

9. A process according to claim 1 further comprising heating the semi-conductor with a temperature increase smaller than or equal to 30° C./second, maintaining a constant temperature until the thermo-migration process is complete;

cooling with decreasing heat radiation in a first cooling stage; and freely cooling down to a removal temperature.

10. A process according to claim 9 wherein the heating and cooling of the semi-conductor takes place according to a ramp function.

11. A process according to claim 1 wherein the semi-conductor is heated to a first given temperature of around 300° C. to 400° C., whereby after reaching the first given temperature of the semi-conductor the area surrounding the semi-conductor is purified whereby the semi-conductor is further heated to a second given temperature of around 600° C. to 700° C., whereby the conductive doping substance reacts with the semi-conducting body of the semi-conductor through droplet formation, and whereby subsequently there is heating to the working temperature of the migration process of around 900° C. to 1100° C., whereby after the end of the thermo-migration process the temperature of the semi-conductor is reduced to a third given temperature of around 650° C., and subsequently the semi-conductor is cooled over a time span of around two to three minutes to a given removal temperature.

12. A process according to claim 7 further comprising moving the sample plunger into a removal and charging position;

opening the sample plunger and taking up the semi-conductor;

bringing the sample plunger into a closed position;

emptying and rinsing the sample plunger with an inert gas;

placing a cool liquid into the sample plunger;

performing thermo-migration by heating and cooling the semi-conductor;

moving the sample plunger into the removal and charging position; and removing the semi-conductor and placing the semi-conductor in a storage area preferably rinsed with nitrogen.

13. A device for producing electrically conductive passages in a disc-form semi-conductor by means of thermo-migration through the production of a temperature gradient between first and second outer surfaces of the semi-conductor and the application of a conductive doping substance on the second outer surface comprising:

a semi-conductor support between a heat source and a cooling device for taking up the semi-conductor;

a heat source that emits a homogenous heat radiation on the outer surface of the semi-conductor turned towards it when the semi-conductor is taken up by the support;

a pyrometer measurement head for measuring the outer surface temperature of the semi-conductor during operation of the device; and wherein at least one of the distance between the support and the heat source and between the support and the cooling device is changeable depending upon the measured outer surface temperature.

14. A device according to claim 13 wherein the area between the heat source and the cooling device is encapsulated and is filled with an inert gas which is a good heat conductor.

15. A device according to claim 14 wherein the gas is hydrogen or helium.

16. A device according to claim 14 or claim 15 wherein the area in the plane of the support is sub-divided.

17. A device according to claim 14 wherein at least one of the gas pressure and the gas flow into at least one area can be changed.

18. A device according to claim 13 wherein the heat source comprises at least one of a directly or indirectly heated furnace.

19. A device according to claim 18 further comprising a plate corresponding essentially to the surface of the support, whereby this plate is heatable by means of at least one of electric resistive heating, inductive heating, electron beam heating and microwave heating.

20. A device according to claim 19 wherein the plate comprises a graphite material pyrolytically sealed with boron nitride.

21. A device according to claim 19 wherein the plate consists of purest ceramics.

22. A device according to claim 13 wherein the heat source comprises a halogen lamp field, which extends at least over the surface of the semi-conductor.

23. A device according to claim 13 or claim 22 wherein the heat source comprises crossed halogen lamp fields positioned in two planes.

24. A device according to claim 13 wherein a mirror reflector (13) is positioned on the side of the heat source oriented opposite the support.

25. A device according to claim 13 wherein the support comprises a frame, moveable in a plane parallel to the longitudinal extension of the heat source.

26. A device according to claim 13 wherein the support comprises pins or webs connected to the cooling device, whereby these pins or webs support the outer surface of the semi-conductor turned towards the cooling device in point-form or line-form.

27. A device according to claim 13 wherein the support comprises a sample plunger connected to the cooling device.

28. A device according to claim 27 wherein the sample plunger comprises a sample cylinder a sample head forming the covering surface of the sample cylinder and taking up the semi-conductor, a sample flange on the under side of the sample cylinder projecting outwards, and a lifting plate sealing the sample cylinder to the under side in a gas-proof way.

29. A device according to claim 28 wherein the sample plunger can, in an axial direction (Z direction), be inserted into and extracted from a recipient, which consists of a ray passage surface turned towards the heat source and a quartz cylinder.

30. A device according to claim 29 wherein the recipient is surrounded by a cylinder-form outer shell, and wherein the cylinder-form outer shell is cooled.

31. A device according to claim 28 wherein the pyrometer measurement head is centrally located within the sample cylinder of the sample plunger, wherein the pyrometer measurement head is oriented via a temperature measurement and gas channel and a measurement window situated in the temperature measurement and gas channel to the first outer surface of the semi-conductor.

32. A device according to claim 31 wherein the pyrometer measurement head has a finely adjustable focusing cone.

33. A device according to claim 31 or claim 32 wherein the pyrometer measurement head works with a wavelength of 2.2 $\mu$m.

34. A device according to claim 31 wherein the pyrometer measurement head is fixed and adjusted on the sample plunger by means of a pyrometer flange and wherein the focusing cone of the pyrometer measurement head is oriented to the upper surface of the semi-conductor in such a way that there is a small measurement spot in the middle of the semi-conductor.

35. A device according to claim 34 wherein the measurement window comprises sapphire.

36. A device according to claim 13 wherein the sample head has three sample head planes, whereby the take-up of the semi-conductor is connected to the first sample head plane, which has the central temperature measurement and gas channel as well as several radially distributed gas channels fed diagonally through the first sample head plane, whereby a gas which is a good heat conductor is fed through these gas channels and exits via nozzle-form openings of the channels, flows under the semi-conductor and is fed through an opening in the base area of the sample cylinder; wherein the second sample head plane of the sample head has diagonal gas channels, the central temperature measurement and gas channel and cool water channels which lead to cooling elements; wherein the third sample head plane of the sample head has a cool liquid inlet, a cool liquid outlet, and a gas inlet and gas outlet for the process gas; and wherein the measurement window which is situated in the optical temperature measurement channel is admitted centrally into the third sample head plane of the sample head.

37. A device according to claim 36 wherein the three sample head planes consist of purest aluminum.

38. A device according to claim 35 wherein the measurement window comprises sapphire.

39. A device according to claim 17 wherein the sample head has three sample head planes, whereby the take-up of the semiconductor is connected to the first sample head plane, which has the central temperature measurement and gas channel as well as several radially distributed gas channels fed diagonally through the first sample head plane, whereby a gas which is a good heat conductor is fed through these gas channels and exits via nozzle-form openings of the channels, flows under the semiconductor and is fed through an opening in the base area of the sample cylinder, whereby the second sample head plane of the sample head has diagonal gas channels, the central temperature measurement and gas channel and cool water channels which lead to cooling elements, and whereby the third sample head plane of the sample head has a cool liquid inlet and a cool liquid outlet as well as a gas inlet and a gas outlet for the process gas, and whereby the measurement window which is situated in the optical temperature measurement channel is admitted centrically into the third sample head plane of the sample head.

40. A device according to claim 39 wherein the three sample head planes consist of purest aluminum.

41. A device according to claim 29 wherein the recipient is surrounded by a cylinder-form outer shell; wherein the cylinder-form outer shell is cooled;

and wherein within the sample plunger is a cooling cylinder.

42. A device according to claim 29 wherein the recipient is surrounded by a cylinder-form outer shell; and wherein within the sample plunger is a cooling cylinder.

* * * * *